(12) United States Patent
Tamm

(10) Patent No.: US 10,568,208 B2
(45) Date of Patent: Feb. 18, 2020

(54) COMPONENT CARRIER WITH A BYPASS CAPACITANCE COMPRISING DIELECTRIC FILM STRUCTURE

(71) Applicant: AT&S Austria Technologie & Systemtechnik Aktiengesellschaft, Leoben (AT)

(72) Inventor: Wilhelm Tamm, Salem (DE)

(73) Assignee: AT & S AUSTRIA TECHNOLOGIE & SYSTEMTECHNIK AKTIENGESELLSCHAFT, Leoben (AT)

(*) Notice: Subject to any disclaimer, the term of this patent is extended or adjusted under 35 U.S.C. 154(b) by 0 days.

(21) Appl. No.: 15/662,406

(22) Filed: Jul. 28, 2017

(65) Prior Publication Data
US 2018/0035543 A1 Feb. 1, 2018

(30) Foreign Application Priority Data

Jul. 29, 2016 (CN) .......................... 2016 1 0619075

(51) Int. Cl.
*H05K 1/18* (2006.01)
*H05K 1/16* (2006.01)
(Continued)

(52) U.S. Cl.
CPC ......... *H05K 1/162* (2013.01); *H01L 21/4857* (2013.01); *H01L 23/49822* (2013.01);
(Continued)

(58) Field of Classification Search
CPC .............................................. H05K 1/182–185
See application file for complete search history.

(56) References Cited

U.S. PATENT DOCUMENTS 5,844,770 A * 12/1998 Fries-Carr ................ H01G 4/32
361/301.5
6,274,224 B1 * 8/2001 O'Bryan ................ H05K 1/162
428/209
(Continued)

FOREIGN PATENT DOCUMENTS

CN        1829420 A       9/2006
CN       18229420 A       9/2006
(Continued)

OTHER PUBLICATIONS

European Patent Office, Extended European Search Report Application No. 17183864.2-1501, dated Oct. 4, 2017, Munich, Germany.
(Continued)

*Primary Examiner* — Hoa C Nguyen
(74) *Attorney, Agent, or Firm* — Robert A. Blaha; Smith Tempel Blaha LLC

(57) ABSTRACT

There is provided a component carrier comprising: (a) a stack of at least one electrically conductive layer structure and at least one electrically insulating layer structure; and (b) a bypass capacitance structure formed on an/or within the stack. The bypass capacitance structure comprises an electrically conductive film structure having a rough surface, a dielectric film structure formed on the rough surface, and a further electrically conductive film structure formed on the dielectric film structure.

17 Claims, 3 Drawing Sheets

(51) Int. Cl.
*H05K 1/02* (2006.01)
*H01L 21/48* (2006.01)
*H01L 23/498* (2006.01)
*H01L 23/66* (2006.01)
*H05K 3/46* (2006.01)
*H05K 3/34* (2006.01)
*H01L 23/00* (2006.01)
*H05K 1/03* (2006.01)
*H05K 1/09* (2006.01)
*H05K 1/11* (2006.01)

(52) U.S. Cl.
CPC .. *H01L 23/49833* (2013.01); *H01L 23/49838* (2013.01); *H01L 23/66* (2013.01); *H05K 1/0231* (2013.01); *H05K 1/181* (2013.01); *H05K 3/467* (2013.01); *H01L 23/49827* (2013.01); *H01L 23/49866* (2013.01); *H01L 23/49877* (2013.01); *H01L 23/49894* (2013.01); *H01L 24/16* (2013.01); *H01L 2223/6666* (2013.01); *H01L 2224/16227* (2013.01); *H01L 2924/19041* (2013.01); *H05K 1/0298* (2013.01); *H05K 1/0306* (2013.01); *H05K 1/09* (2013.01); *H05K 1/115* (2013.01); *H05K 3/3436* (2013.01); *H05K 2201/10734* (2013.01)

(56) References Cited

U.S. PATENT DOCUMENTS

| 7,943,858 | B2 | 5/2011 | Lee et al. | |
|---|---|---|---|---|
| 2004/0012938 | A1* | 1/2004 | Sylvester | H01L 21/4857 361/794 |
| 2004/0118600 | A1* | 6/2004 | Lee | H05K 1/162 174/260 |
| 2006/0022304 | A1* | 2/2006 | Rzeznik | H01G 4/08 257/532 |
| 2006/0146476 | A1* | 7/2006 | Srinivasan | H01G 4/10 361/306.3 |
| 2006/0196691 | A1* | 9/2006 | Ahn | H05K 1/162 174/256 |
| 2006/0203421 | A1* | 9/2006 | Morris | H01F 17/0033 361/277 |
| 2006/0220167 | A1* | 10/2006 | Min | H01L 21/4857 257/499 |
| 2008/0307620 | A1* | 12/2008 | Lee | H01G 4/12 29/25.03 |
| 2010/0270261 | A1* | 10/2010 | Figueroa | H01G 4/008 216/6 |

FOREIGN PATENT DOCUMENTS

| EP | 1 005 260 A2 | 5/2000 |
|---|---|---|
| EP | 1 100 295 A2 | 5/2001 |
| EP | 1 699 275 A2 | 9/2006 |
| EP | 1 646 072 A2 | 12/2006 |

OTHER PUBLICATIONS

SIPO (CN); Office Action in Application 201610619075.7, dated Aug. 5, 2019, pp. 1-10, Beijing, China.
English translation of Office Action in Application 201610619075.7, dated Aug. 5, 2019, pp. 1-3.

* cited by examiner

COMPONENT CARRIER WITH A BYPASS CAPACITANCE COMPRISING DIELECTRIC FILM STRUCTURE

This application claims the benefit of the filing date of Chinese Patent Application No. 2016106190757 filed 29 Jul. 2016, the disclosure of which is hereby incorporated herein by reference.

TECHNICAL FIELD

Embodiments of the invention generally relate to the technical field of component carriers onto which electronic components can be placed in order to form an electronic assembly. In particular, embodiments of the invention relate to a component carrier comprising a bypass capacitor.

ART BACKGROUND

High-speed digital circuits typically present serious challenges related to the design of a power supply. For example, numerous logic gates are rapidly turned on and off and short surges of current are continuously drawn from an electrically conductive layer being associated with a power supply. Voltage regulators are often unable to adequately supply current for these surges. This often results in unwanted noise being present at voltage rails that can impair the functionality of electronic circuits or even result in total failure of electronic circuits.

A known solution to the problems mentioned above is the use of a bypass capacitor, which acts like a small, low-impedance power supply for all the short surges of current, in particular switching current being associated with switching a digital electronic component. Therefore, many component carriers need a plurality of bypass capacitors, which are strategically placed on or within the component carrier. In this respect, the most important parameter of an appropriate bypass capacitor is its ability to supply a current instantaneously when such a current is needed.

Bypass capacitors are typically realized by means of discrete electronic components. However, such discrete bypass capacitors regularly exhibit an internal parasitic inductance which limits their ability to rapidly supply an appropriate amount of current. This has a negative impact on the propagation and/or advancement of high frequency signals such as e.g. signals having fast clock rate.

A common method for forming (bypass) capacitances on or within a component carrier is to place a thin layer of FR-4 material between two conductive layers. For instance a commonly used FR-4 core between copper conductive layers comprises a capacitance of about 50 pF per square inch.

There may be a need for proving a component carrier with a bypass capacitor having an large capacitance.

SUMMARY

This need may be met by the subject matter according to the independent claims. Advantageous embodiments of the present invention are described by the dependent claims.

According to a first aspect of the invention there is provided a component carrier comprising (a) a stack of at least one electrically conductive layer structure and at least one electrically insulating layer structure; and (b) a bypass capacitance structure formed on and/or within the stack. The bypass capacitance structure comprises an electrically conductive film structure having a rough surface, a dielectric film structure formed on the rough surface, and a further electrically conductive film structure formed on the dielectric film structure.

The described component carrier is based on the idea that by forming a capacitance structure comprising or consisting of two electrically conductive film structures and one dielectric film structure sandwiched in between the two electrically conductive film structures a build-up structural arrangement can be created which can be used as a bypass capacitance structure for a component carrier. The dielectric film structure may be realized by means of a microscopic coating layer made from a highly insulating material (for example a dielectric metal oxide). At least the electrically conductive film structure is provided with a rough surface such that the effective surface for the bypass capacitance structure will be increased.

The rough surface may exhibit a spatially regular shape. Preferably, the rough surface exhibits a spatially irregular shape which may have the advantage that it will be much easier to find an appropriate physical or chemical treatment procedure in order to form the rough surface.

Within the component carrier the bypass capacitance structure can be realized respectively used as a high capacitance power supply plane for digital circuits. Due to the roughened interface surface at least between the electrically conductive film structure and the dielectric film structure a significant increase of the specific surface area can be achieved. This results in a highly increased capacitance of the power supply plane. In accordance with basic principles of electronic circuits a high capacitance of a power supply plane has the positive effect that even in case of high-frequency digital signals propagating within or at the component carrier there will be enough short-term supply current available for compensating short surges of current which are drawn from the power supply plane. As has already been mentioned above, such surges may be associated with a switching operation of digital electronic components.

As a quantitative example with regard to the value of the capacitance structure one may consider the capacitance C of a parallel-plate capacitor constructed of two parallel plates both of area A and separated from each other by a distance d:

$$C = \varepsilon_r \varepsilon_0 A / d$$

Thereby, $\varepsilon_r$ is the relative static permittivity (sometimes called the dielectric constant) of the material between the two plates (for a vacuum, $\varepsilon_r = 1$) and $\varepsilon_r$ is the dielectric constant ($= 8.854 \times 10^{-12}$ As/Vm).

From the above formula one can take that the capacitance C is proportional to the area A of the overlap between the electrically conductive film structure and the further electrically conductive film structure. Further, the capacitance C is inversely proportional to the separation d between the electrically conductive film structure and the further electrically conductive film structure. The closer the two electrically conductive film structures are the larger the capacitance C is.

The described component carrier may rely on an embedded capacitance technology which may allow for a microscopic thin dielectric layer conformal deposited on a roughened interface surface between the two mentioned electrically conductive film structures. Within the design of the described component carrier the two electrically conductive film structures may be used as two conductor planes providing for a durable source of distributive decoupling capacitance structures. These two conductor planes can then take the place of conventional discrete (bypass) capacitors.

At this point it is mentioned that in particular in case the stack comprises a plurality of layers with an alternating sequence of electrically conductive layer structures and electrically insulating layer structures there may be provided, within or between different layer structures, altogether more than one bypass capacitance structure as described above. This may allow to provide in an easy and effective manner a compensation for current surge demands at different locations within the described component carrier.

In the context of this document, the term "component carrier" may particularly denote any type of support structure which is capable of accommodating one or more electronic components thereon and/or therein for providing both mechanical support and electrical connectivity. The component carrier may be for instance a PCB or generally any type of flexible, semi-flexible or rigid substrate.

With the described component carrier the capacitance overlap area between different electrically conductive films or different electrically conductive film structures can be reduced while providing for the same capacitance value. This may allow for realizing different voltage levels within a single split voltage plane layer, leading to a reduced layer count and lower cost. Further, parasitic inductances, which are in particular yielded by discrete bypass capacitors, can be reduced. The same holds for an unwanted crosstalk between different signals propagating along spatially neighboring conductor tracks. As a consequence, and improved signal integrity in particular at higher signal clock rates can be provided.

The described bypass capacitance structure may be formed at different locations in or at the component carrier. For instance, the bypass capacitance structure can be applied directly on top of the component carrier as an outlay. Further, the bypass capacitance structure can be used as a core layer of and within the component carrier. Furthermore, the bypass capacitance structure may be realized as a sequential build-up structure within a known Every Layer Interconnection (ELIC) process for manufacturing the component carrier. All these possibilities allow for a great freedom of design in particular with respect to a provision of the required voltage stability of high speed signal connections at any location of an electronic assembly respectively circuit formed at and/or within the described component carrier.

According to an embodiment of the invention the rough surface has an effective surface area which, compared to a corresponding planar surface area, is larger by a factor of 1.2 and in particular larger by a factor in a range between 1.5 and 30. By this way, compared to a not roughened surface, the capacitance can be increased by the same amount.

According to a further embodiment of the invention the rough surface comprises an average peak-to-valley height value, $R_z$, of 1 µm to 50 µm, in particular 1 µm to 25 µm, more particularly 2 µm to 9 µm.

According to the above given formula $C=\varepsilon_r \varepsilon_o A/d$, the larger the area A is, the larger is the capacitance C. Thus, the larger the average peak-to-valley height value $R_z$ is, the larger may be the surface area.

When the rough surface is viewed in a cross-sectional view, a "landscape" of peak and valley shapes may be visible. In this respect, $R_{pm}$ may be the average maximum peak height, which is found by averaging the heights of the highest peaks. $R_{vm}$ may be the average maximum valley depth, which is found by averaging the depths of the lowest valleys. $R_z$ may then be described as $R_{pm}-R_{vm}$.

According to a further embodiment of the invention the dielectric film structure comprises a thickness which is in the range between 10 nm and 2000 nm, in particular lower than 1000 nm.

According to the above given formula $C=\varepsilon_r \varepsilon_o A/d$, the closer the respective sheets respectively the electrically conductive film structures are located with respect to each other, the greater is the capacitance C. A very high Rz value of the rough surface together with a very thin dielectric layer may provide a very high capacitance.

According to a further embodiment of the invention the dielectric film structure comprises a material having a dielectric constant which is in the range between 3 and 1000 and in particular between 6 and 1000.

According to the above given formula $C=\varepsilon_r \varepsilon_o A/d$, the higher the dielectric constant $\varepsilon_r$, also termed relative permittivity, of the dielectric layer is, the larger is the capacitance C.

Permittivity is directly related to electric susceptibility, which is a measure of how easy a dielectric material is getting polarized in response to an impacting external electric field. In international system (SI) units, the permittivity ε is measured in Farads per meter (F/m) and the electric susceptibility X is without a dimension. Permittivity and susceptibility are related to each other according to the formula $E=\varepsilon_r \varepsilon_0=(1+X) \varepsilon_0$, wherein $\varepsilon_r$ is the relative permittivity or dielectric constant of the material, and $\varepsilon_0=8.8541878176\times10^{-12}$ F/m is the vacuum permittivity. The dielectric constant value of FR-4, which is a typical electrically insulating material of a component carrier such as printed circuit board (PCB), is 4.2. Materials such as CaCu3Ti4O12 and various members of the series Ln2/3Cu3Ti4O12 with Ln=La, Ce, Pr, Nd, Sm, Eu, Gd, Tb, Dy, Ho, Er and Tm may have an extremely high value for its dielectric constant.

According to a further embodiment of the invention the dielectric film structure comprises a material selected from a group consisting of diamond-like carbon, aluminum oxide, silicon nitride, silicon oxide, neodymium oxide, hafnium oxide, zirconium oxide, or a combination of these materials.

The dielectric constants $\varepsilon_r$ of these materials is comparatively high. The dielectric constant for diamond-like carbon is approximately 3, for aluminum oxide approximately 9, for silicon nitride approximately 7, for silicon oxide approximately 3.9, for hafnium oxide approximately 25 and for zirconium oxide approximately 25. All these materials are suitable for manufacturing the bypass capacitance structure and allow for a large capacitance.

According to a further embodiment of the invention the dielectric film structure has been formed by chemical vapor deposition and/or by physical vapor deposition and/or by galvanic coating and/or by electrophoresis.

Chemical vapor deposition (CVP) is a chemical process which is often used to produce high quality, high-performance, solid materials. CVP may include more specific processes such as atmospheric pressure CVD (APCVD), low-pressure CVD (LPCVD), or ultrahigh vacuum CVD (UHVCVD).

Physical vapor deposition (PVD) describes a variety of vacuum deposition methods used to deposit thin films by the condensation of a vapor comprising the desired film material at various surfaces. Such a coating involves purely physical processes such as high-temperature vacuum evaporation with subsequent condensation, or plasma sputter bombardment rather than involving a chemical reaction at the surface to be coated as in CVP.

The dielectric film structure may be conformally formed on or over the electrically conductive layer. Every region of the rough surface of the electrically conductive layer may be coated by means of a vapor deposition with the same amount of dielectric material. Thus, every peak of the rough surface and every valley of the rough surface of the electrically conductive film structure may be coated with the same amount respectively thickness of dielectric material. As a consequence, the dielectric layer comprises at least approximately a uniform thickness.

It is mentioned that the dielectric film structure can also be formed with other known methods such as for example RF sputtering, RF reactive sputtering, DC reactive sputtering utilizing a pulsed DC power supply, etc.

According to a further embodiment of the invention the further electrically conductive film comprises a further rough surface. This may mean that there will be a rough interface surface also between the dielectric film structure and the further electrically conductive film structure. According to exemplary embodiments also the further rough surface may exhibit a spatially irregular shape.

According to a further embodiment of the invention the further rough surface is formed conformally at the dielectric film structure.

The further electrically conductive material may be directly formed on or at the dielectric film structure, for example by means of CVD or PVD methods. The bottom side of the dielectric film structure, which is conformally formed on or at the rough surface of the electrically conductive film structure, may comprise an irregular shaped surface. Because the dielectric film structure comprises a uniform thickness, also the top side of the dielectric film structure, which is opposite to the bottom side of the dielectric film structure, exhibits an irregular shaped surface. When the further electrically conductive material is formed on or at the dielectric film structure, the further rough surface is then conformally formed on or at the dielectric layer.

According to a further embodiment of the invention the further rough surface comprises at least approximately the same average peak-to-valley height value, $R_z$, as the rough surface. This may provide the advantage that the capacitance of the bypass capacitance structure may be further increased by the further rough surface.

According to a further embodiment of the invention the at least one electrically conductive layer structure, the electrically conductive film structure and/or the further electrically conductive film structure comprises at least one material of the group consisting of copper, aluminum, and nickel. Also this may provide the advantage that the described bypass capacitance structure with its advantageous effects and also the entire component carrier can be realized by employing well known and approved process technologies.

According to a further embodiment of the invention the electrically conductive film structure is assigned to an electrical power supply plane layer at or within the component carrier and/or the further electrically conductive film structure is assigned to an electrical ground plane layer. This may provide the advantage that the large capacitance being provided by the described bypass capacitance structure can be effectively used for providing a very stable supply voltage for any electronic component being mounted within or at the described component carrier.

According to a further embodiment of the invention the at least one electrically insulating layer structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide.

According to a further embodiment of the invention the component carrier is shaped as a plate. This may contribute to a compact design of the component carrier which nevertheless provides a large basis for mounting electronic components thereon.

According to a further embodiment of the invention the component carrier is configured as one of the group consisting of a printed circuit board and a substrate.

In the context of this document, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of this document, the term "substrate" may particularly denote a small component carrier having substantially the same size as an electronic component to be mounted thereon. A component carrier may also be a so called intermediate carrier which can be used as an adapter for spatially spreading contact terminals being formed at an electronic component, in particular a bare die, such that the electronic component can be contacted with contact pads formed e.g. at a PCB.

According to a further embodiment of the invention the component carrier is a laminate-type component carrier. In such an embodiment, the component carrier is a compound of multiple layer structures which are stacked and connected together by applying a pressing force, if desired accompanied by heat.

According to a further aspect of the invention there is provided an electronic system comprising a component carrier as described above; and an electronic component. The electronic component is embedded in the component carrier. An embedded component may provide the advantage that the integration level for an electronic circuit assembly being mounted to the component carrier can be increased when connecting embedded electronic component in such a manner that it forms a part of the electronic circuit.

According to a further embodiment of the invention the electronic component may be selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip.

According to a further aspect of the invention there is provided a method for manufacturing a component carrier, the method comprising (a) forming a stack of at least one electrically conductive layer structure and at least one electrically insulating layer structure; and (b) arranging a bypass capacitance structure on an/or within the stack, wherein the bypass capacitance structure is formed with an electrically conductive film structure having a rough surface, a dielectric film structure on the rough surface, and a further electrically conductive film structure formed on the dielectric film structure.

Also the described method is based on the idea that by forming a capacitance structure comprising or consisting of two electrically conductive film structures and a dielectric film structure sandwiched in between these electrically conductive film structures a build-up structural arrangement can be created which can be used as a bypass capacitance structure for a component carrier and which can be integrally formed within the component carrier.

The described manufacturing method can be implemented within a standard High Density Interconnection (HDI) process and/or any many other substrate manufacturing processes.

The dielectric film structure may be deposited roll to roll in a cost effective web process.

It has to be noted that embodiments of the invention have been described with reference to different subject matters. In particular, some embodiments have been described with reference to a component carrier whereas other embodiments have been described with reference to a method for manufacturing such a component carrier. However, a person skilled in the art will gather from the above and the following description that, unless other notified, in addition to any combination of features belonging to one type of subject matter also any combination between features relating to different subject matters (i.e. component carrier and method) is considered as to be disclosed with this technical description of the invention.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION

Figure 1:
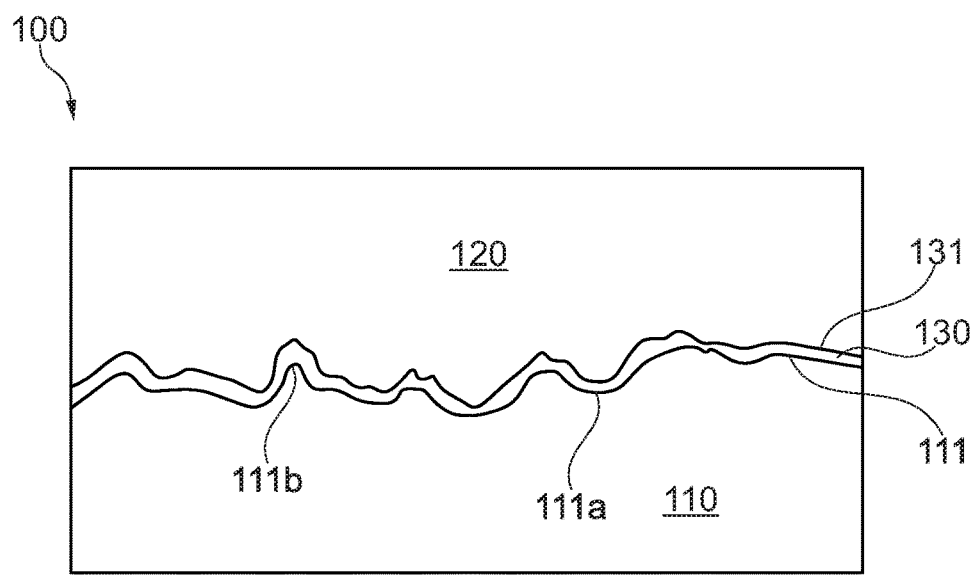
FIG. 1 shows a cross-sectional view of a bypass capacitance structure being realized by means of a conformal foil.

The illustration in the drawing is schematic. It is noted that in different figures, similar or identical elements or features are provided with the same reference signs. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously all such spatially relative terms refer to the orientation shown in the figures only for ease of description and are not necessarily limiting as an apparatus according to an embodiment of the invention can assume orientations different than those illustrated in the figures when in use.

FIG. 1 shows a cross-sectional view of a bypass capacitance structure being realized by means of a conformal foil 100. The conformal foil 100 comprises an electrically conductive film structure 110 which is realized by a thin layer of conductive material such as copper. The electrically conductive film structure 110 has a rough surface 111 which exhibits a spatially irregular shape with valleys 111a and peaks 111b.

Further, the conformal foil 100 comprises a dielectric layer 130 conformally formed on the rough surface 111. The dielectric film structure 130 is realized by means of a thin layer of dielectric material. According to the exemplary embodiment described here the dielectric film structure 130 has a uniform thickness.

Furthermore, the conformal foil 100 comprises a further electrically conductive film structure 120 being formed on the dielectric film structure 130. The dielectric film structure 130 is sandwiched between the electrically conductive film structure 110 and the further electrically conductive film structure 120.

The further electrically conductive film structure 120 comprises a further rough surface 131, which is formed conformally on the dielectric film structure 130. The further rough surface 131 also exhibits a spatially irregular shape.

It should be clear for a person skilled in the art that due to the conformal interfaces between (a) the "rough" electrically conductive film structure 110 and the dielectric film structure 130 and (b) the dielectric film structure 130 and the "rough" further electrically conductive film structure 120 the dielectric film structure 130 must comprise two rough surfaces. In accordance with basic physical principles the roughening of the electrically conductive film structures 110, 120 increases the capacitance of the conformal foil 100.

Figure 2:
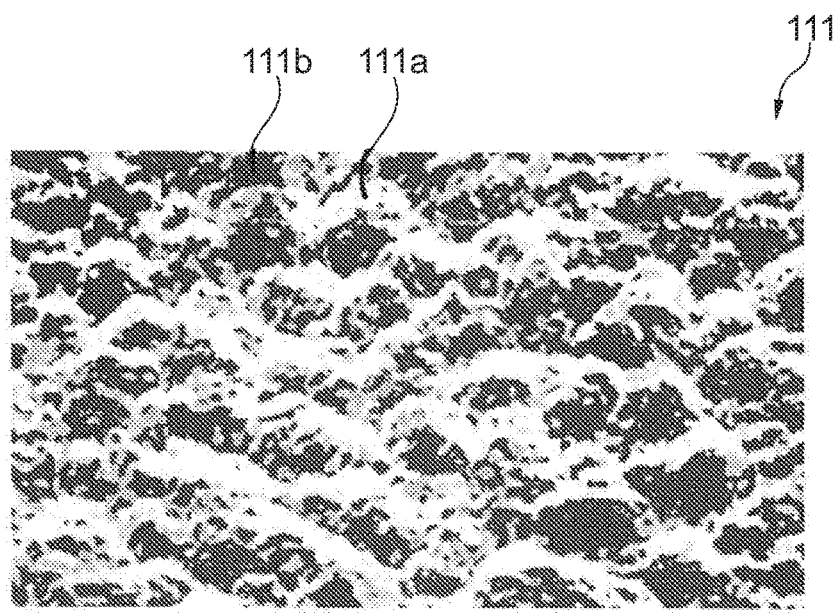
FIG. 2 shows an electron-microscopic image of a rough surface of the conformal foil depicted in FIG. 1.

FIG. 2 shows an electron-microscopic image of the rough surface 111 of the conformal foil depicted in FIG. 1. Valleys 111a and peaks 111b are visible. These peaks 111b and valleys 111a are distributed randomly and there is no spatial periodicity visible. This means that the rough surface 111 exhibits an irregular shape.

Figure 3:
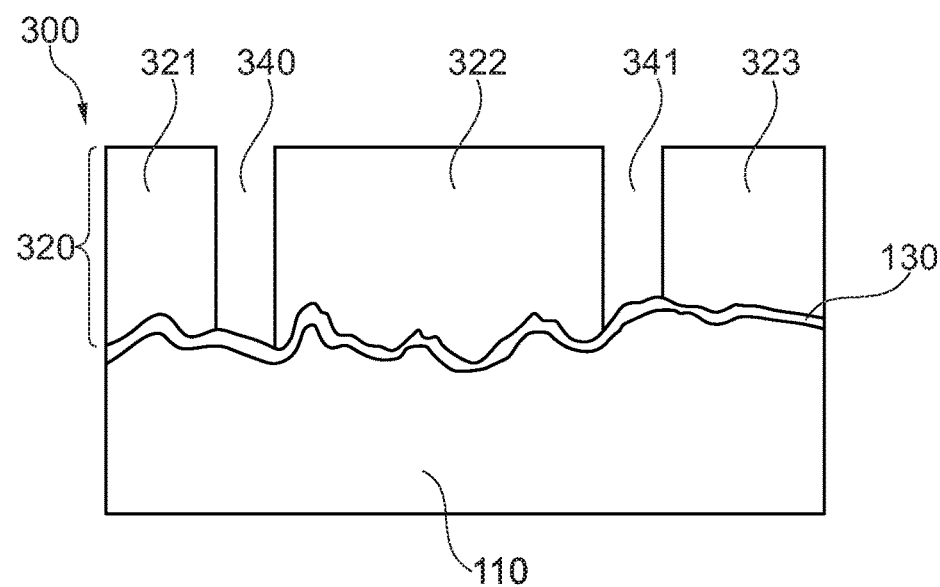
FIG. 3 shows in a cross-sectional view a bypass capacitance structure, wherein one electrically conductive film structure of the bypass capacitance structure is spatially structured with recesses.

FIG. 3 shows in a cross-sectional view a bypass capacitance structure 300 being realized by a conformal foil, wherein an upper electrically conductive film structure 320 of the bypass capacitance structure 300 is spatially structured with recesses or gaps 340, 341. Due to the gaps 340, 341 different conductive material portions 321, 322, 323 are formed. Provided that there is an appropriate electrical connection (not shown) to the material portions 321, 322, 323 each one these material portions 321, 322, 323 forms part of the bypass capacitance structure.

Figure 4:
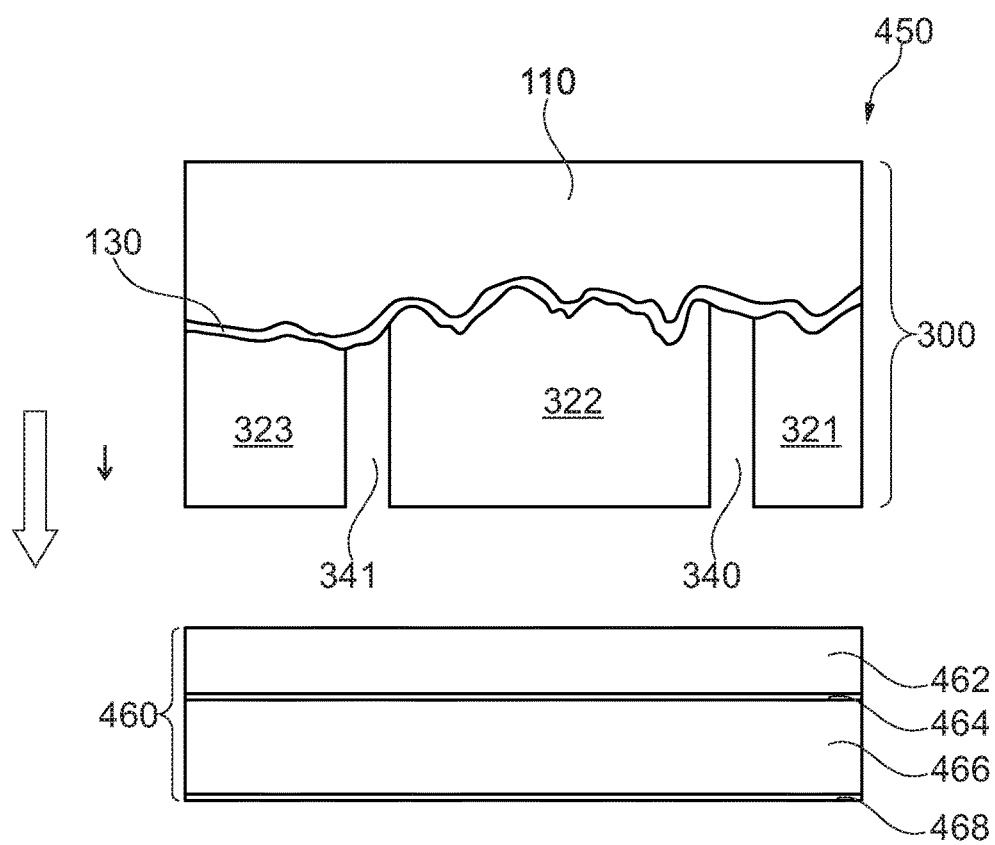
FIG. 4 shows in a cross-sectional view an intermediate step when forming a component carrier according to an embodiment of the invention.

FIG. 4 shows in a cross-sectional view an intermediate step when forming a component carrier 450 according to an embodiment of the invention. As can be taken from this Figure, the conformal structured foil 300 is placed upside down onto a layered structure 460 representing at least a part of the component carrier 450. According to the exemplary embodiment described here the layered structure 460 is a stack comprising an electrically insulating layer 462, an electrically conductive layer 464, a further electrically insulating layer 466, and a further electrically conductive layer 468. It is mentioned that the number of layers of the stack 460 is not limited to the described embodiment. The electrically conductive layers 464, 468 may be spatially structured. Further, not depicted vias may be formed within the electrically insulating layers 466, 468.

Figure 5:
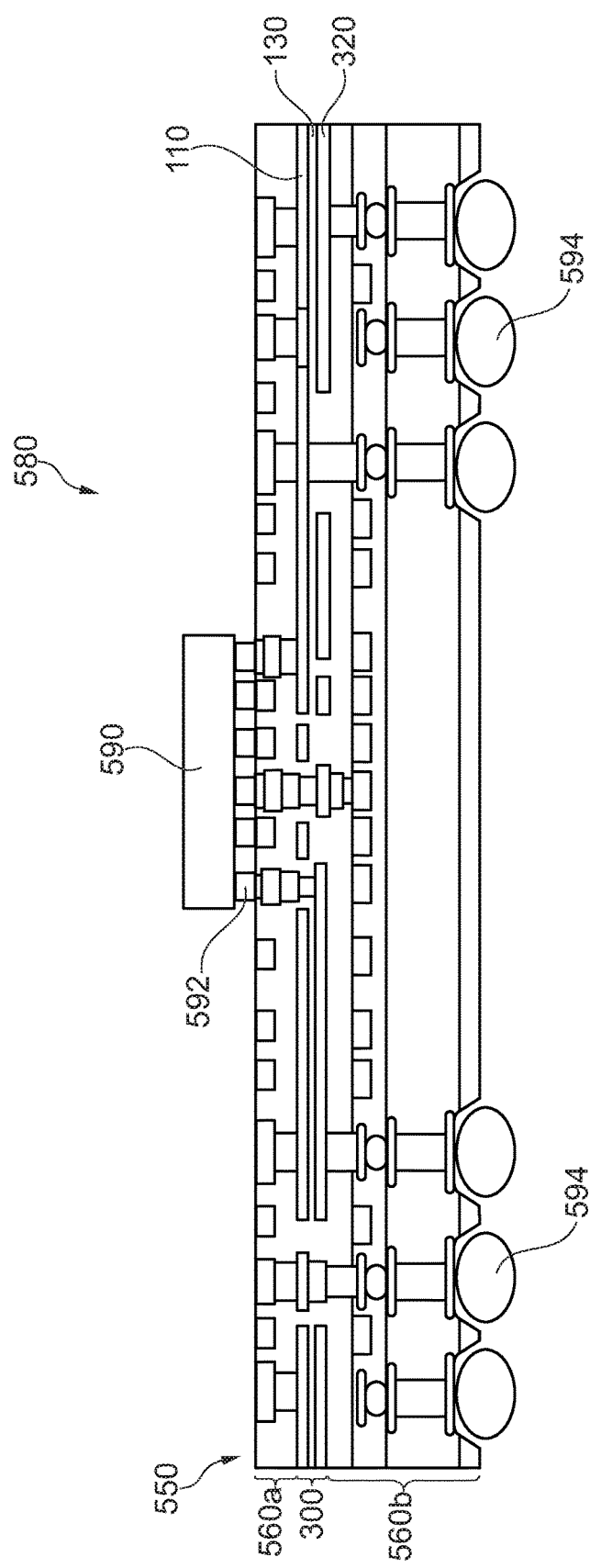
FIG. 5 shows in a cross-sectional view an electric system comprising an electronic component is mounted on a component carrier comprising an embedded bypass capacitance structure being realized by means of a conformal foil.

FIG. 5 shows in a cross-sectional view an electric system 580 comprising a component carrier 550 and an electronic component 590 mounted on the upper surface of the component carrier 550. The component carrier 550 comprises two stacks respectively two layered structures 560a, 560b. Each one of these two stacks 560a, 560b comprises at least one electrically insulating layer and at least one electrically conductive layer. As can be seen from FIG. 5, the electrically conductive layer exhibit a spatial structuring and metallic interconnections are formed in order to realize an appropriate three dimensional conductor structure extending through the component carrier 450. For the sake of clarity of the illustration the stack layers and the metallic interconnections are not denominated with reference numerals.

As can be seen from FIG. 5, a bypass capacitance structure realized by a conformal foil 300 which is sandwiched by the two stacks 560a, 560b. Further, the conformal foil 300 is horizontally subdivided in different portions.

According to the exemplary embodiment described here the component carrier 450 is an electronic interconnection device, which is connected to terminals 592 of the electronic component 590. At a lower side of the electronic interconnection device 450 there are provided (ball shaped) terminals 594 which are electrically connected to the terminals 592 in an application specific appropriate manner. In this way, electrical signals may be transported between the terminals 592 of the electronic component 590 and the (ball shaped) terminals 594 via the (various portions of the) conformal foil 300, via appropriate metallic interconnects and via appropriately structured electrically conductive layers of the two stacks 560a and 560b.

According to the exemplary embodiment described here one of the electrically conductive film structure 110 and the further electrically conductive film structure 320 is assigned to a voltage supply plane of the electric system 580. The other one of the electrically conductive film structure 110 and the further electrically conductive film structure 320 is assigned to electric ground plane of the electric system 580. As has already been mention above in the general description of embodiments of the invention the capacitance of the conformal foil 300 provides for a timely smoothening of the level of the supply voltage. As a consequence, the signal integrity of signals, in particular fast digital AC signals, propagating within the electronic interconnection device 450 will be increased due to the capacitance of the bypass capacitance structure 300 being realized by means of the conformal foil 300. The described surface roughening of the electrically conductive film structures 110, 320 contributes to a high capacitance which increases the signal integrity.

It should be noted that the term "comprising" does not exclude other elements or steps and the use of articles "a" or "an" does not exclude a plurality. Also elements described in association with different embodiments may be combined. It should also be noted that reference signs in the claims should not be construed as limiting the scope of the claims.

LIST OF REFERENCE NUMERALS 100 bypass capacitance structure/conformal foil
110 electrically conductive film structure
111 rough surface
111a rough surface valley
111b rough surface peak
120 further electrically conductive film structure
130 dielectric film structure
131 further rough surface
300 bypass capacitance structure/conformal foil
320 further electrically conductive film structure
321 conductive material portion
322 conductive material portion
323 conductive material portion
340 recess
341 further recess
450 component carrier/electronic interconnection device
460 layered structure/stack
462 electrically insulating layer
464 electrically conductive layer
466 further electrically insulating layer
468 further electrically conductive layer
550 component carrier
560a layered structure/stack
560b layered structure/stack
580 electric system
590 electronic component
592 terminals
594 (ball shaped) terminals

The invention claimed is:
1. An electronic system, comprising:
a component carrier having
a stack of at least one electrically conductive layer structure and at least one electrically insulating layer structure; and
a bypass capacitance structure formed on and/or within the stack;
wherein the bypass capacitance structure comprises an electrically conductive film structure having a rough surface, a dielectric film structure formed on the rough surface, and a further electrically conductive film structure formed on the dielectric film structure;
wherein the dielectric film structure has been formed by physical vapor deposition;
an electronic component,
wherein the electronic component is connected to the component carrier, and
wherein the electrically conductive film structure is arranged spatially closer to the electronic component than the further electrically conductive film structure; and
a metallic interconnection,
wherein the metallic interconnection electrically connects the electronic component with the further electrically conductive film structure, and wherein the metallic interconnection does not connect the electronic component with the electrically conductive film structure.

2. The electronic system as set forth in the claim 1, wherein the rough surface has an effective surface area which, compared to a corresponding planar surface area, is larger by a factor of at least 1.2.

3. The electronic system as set forth in claim 1, wherein the rough surface comprises an average peak-to-valley height value, $R_z$, of 1 μm to 50 μm.

4. The electronic system as set forth in claim 1, wherein the dielectric film structure comprises a thickness which is in the range between 10 nm and 2000 nm.

5. The electronic system as set forth in claim 1, wherein the dielectric film structure comprises a material having a dielectric constant which is in the range between 3 and 1000.

6. The electronic system as set forth in claim 1, wherein the dielectric film structure comprises a material selected from a group consisting of diamond-like carbon, aluminum oxide, silicon nitride, silicon oxide, neodymium oxide, hafnium oxide, zirconium oxide, or a combination of these materials.

7. The electronic system as set forth in claim 1, wherein the further electrically conductive film comprises a further rough surface.

8. The electronic system as set forth in preceding claim 7, wherein the further rough surface is formed conformally at the dielectric film structure.

9. The electronic system as set forth in claim 8, wherein the further rough surface comprises at least approximately the same average peak-to-valley height value, $R_z$, as the rough surface.

10. The electronic system as set forth in claim 1, wherein the at least one electrically conductive layer structure, the electrically conductive film structure and/or the further electrically conductive film structure includes at least one material of the group consisting of copper, aluminum, and nickel.

11. The electronic system as set forth in claim 1, wherein the electrically conductive film structure is assigned to an electrical power supply plane layer at or within the component carrier and/or the further electrically conductive film structure is assigned to an electrical ground plane layer.

12. The electronic system as set forth in claim 1, wherein the at least one electrically insulating layer structure comprises at least one of the group consisting of resin, Bismaleimide-Triazine resin, cyanate ester, glass, glass fibers, prepreg material, polyimide, liquid crystal polymer, epoxy-based Build-Up Film, FR4 material, a ceramic, and a metal oxide.

13. The electronic system as set forth in claim 1, wherein the component carrier is shaped as a plate.

14. The electronic system as set forth in claim 1, wherein the component carrier is configured as one of the group consisting of a printed circuit board and a substrate.

15. The electronic system as set forth in claim 1, wherein the component carrier is a laminate-type component carrier.

16. The electronic system as set forth in claim 1, wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip.

17. A method for manufacturing an electronic system comprising a component carrier and an electronic component, the method, comprising:
    forming a stack of at least one electrically conductive layer structure and at least one electrically insulating layer structure; and
    arranging a bypass capacitance structure on and/or within the stack, wherein the capacitance structure is formed by
        forming an electrically conductive film structure having a rough surface;
        forming a dielectric film structure on the rough surface by physical vapor deposition; and
        forming a further electrically conductive film structure on the dielectric film structure;
    connecting the electronic component to the component carrier such that the electrically conductive film structure is arranged spatially closer to the electronic component that the further electrically conductive film structure; and
    forming a metallic interconnection that electrically connects the electronic component with the further electrically conductive film structure, and
    so that the metallic interconnection does not connect the electronic component with the electrically conductive film structure.

* * * * *